United States Patent
Roy

(10) Patent No.: US 9,795,061 B2
(45) Date of Patent: Oct. 17, 2017

(54) DATA CENTER FACILITY DESIGN CONFIGURATION

(71) Applicant: Switch LTD, Las Vegas, NV (US)

(72) Inventor: Rob Roy, Las Vegas, NV (US)

(73) Assignee: Switch, Ltd., Las Vegas, NV (US)

(*) Notice: Subject to any disclaimer, the term of this patent is extended or adjusted under 35 U.S.C. 154(b) by 0 days.

(21) Appl. No.: 14/946,594

(22) Filed: Nov. 19, 2015

(65) Prior Publication Data

US 2016/0157387 A1 Jun. 2, 2016

Related U.S. Application Data

(63) Continuation of application No. 13/815,911, filed on Mar. 15, 2013, now Pat. No. 9,198,331.

(51) Int. Cl.
*H05K 7/20* (2006.01)

(52) U.S. Cl.
CPC ..... *H05K 7/20745* (2013.01); *H05K 7/20827* (2013.01)

(58) Field of Classification Search
CPC . G06F 1/181–1/182; H05K 7/20218–7/20381; H05K 7/20409–7/20418; H05K 7/20009–7/202; H01L 23/367–23/3677; H01L 23/473; H01L 23/46–23/467
USPC ...... 361/676–678, 679.46–679.54, 688–723; 165/80.1–80.5, 104.33, 185; 174/15.1–15.3, 16.1–16.3, 547, 548;
(Continued)

(56) References Cited

U.S. PATENT DOCUMENTS

| 1,363,407 A | 12/1920 | Goudie |
| 2,330,769 A | 9/1943 | Wichner |

(Continued)

FOREIGN PATENT DOCUMENTS

| GB | 2228024 A | 8/1990 |
| WO | WO02052107 | 7/2002 |

OTHER PUBLICATIONS

International Search Report issued Aug. 7, 2014 in corresponding PCT/US14/30716.
(Continued)

*Primary Examiner* — Anthony Haughton
*Assistant Examiner* — Razmeen Gafur
(74) *Attorney, Agent, or Firm* — Weide & Miller, Ltd.

(57) ABSTRACT

The methods and apparatuses described herein is a data center. In one embodiment is described a data center comprising: a building having a plurality of rooms and first and second exterior load walls disposed on opposite sides of the building; a plurality of air handler and fluid cooler devices disposed exterior to the building along the first exterior load wall; a plurality of condenser unit devices disposed exterior to the building along the second exterior load wall; a data sector disposed inside the building, adjacent to the first exterior load wall; three separate UPS and substation distribution equipment rooms, each containing UPS and substation distribution equipment therein, as well as air conditioning equipment that is connected to certain of the plurality of condenser unit devices; and a power spine room disposed between the three separate UPS and substation distribution equipment rooms and the data sector, the power spine room including a plurality of PDU devices.

33 Claims, 4 Drawing Sheets

(58) Field of Classification Search
USPC ... 257/712–722, E23.088; 24/453, 458–459; 454/184; 312/236
See application file for complete search history.

(56) References Cited

U.S. PATENT DOCUMENTS

| | | | |
|---|---|---|---|
| 3,192,306 A | 6/1965 | Skonnord |
| 3,202,580 A | 8/1965 | Bell |
| 3,513,326 A | 5/1970 | Potts |
| 3,840,124 A | 10/1974 | Atwater |
| 3,985,957 A | 10/1976 | Torn |
| 4,028,293 A | 6/1977 | Van Den Berg |
| 4,073,099 A | 2/1978 | Van Der et al. |
| 4,102,463 A | 7/1978 | Schmidt |
| 4,118,608 A | 10/1978 | Kussy |
| 4,171,029 A | 10/1979 | Beale |
| 4,189,990 A | 2/1980 | Kittler |
| 4,233,858 A | 11/1980 | Rowlett |
| 4,258,271 A | 3/1981 | Chappell |
| 4,320,261 A | 3/1982 | Scerbo et al. |
| 4,434,390 A | 2/1984 | Elms |
| 4,453,117 A | 6/1984 | Elms |
| 4,456,867 A | 6/1984 | Mallick et al. |
| 4,461,986 A | 7/1984 | Maynard et al. |
| 4,467,260 A | 8/1984 | Mallick |
| 4,472,920 A | 9/1984 | Simpson |
| 4,476,423 A | 10/1984 | Mallick |
| 4,528,789 A | 7/1985 | Simpson |
| 4,548,164 A | 10/1985 | Ylonen et al. |
| 4,602,468 A | 7/1986 | Simpson |
| 4,620,397 A | 11/1986 | Simpson et al. |
| 4,663,911 A | 5/1987 | Gracia |
| 4,797,783 A | 1/1989 | Kohmoto |
| 4,996,909 A | 3/1991 | Vache et al. |
| 5,003,867 A | 4/1991 | Sodec et al. |
| 5,005,323 A | 4/1991 | Simpson et al. |
| 5,142,838 A | 9/1992 | Simpson et al. |
| 5,237,484 A | 8/1993 | Ferchau |
| 5,271,585 A | 12/1993 | Zetena |
| 5,312,296 A | 5/1994 | Aalto et al. |
| 5,322,646 A | 6/1994 | Wright et al. |
| 5,438,781 A | 8/1995 | Landmann |
| 5,473,114 A | 12/1995 | Vogel |
| 5,544,012 A | 8/1996 | Koike |
| 5,545,086 A | 8/1996 | Sharp |
| 5,570,740 A | 11/1996 | Flores et al. |
| 5,600,924 A | 2/1997 | Forsberg |
| 5,657,641 A | 8/1997 | Cunningham et al. |
| 5,704,170 A | 1/1998 | Simpson |
| 5,743,063 A | 4/1998 | Boozer |
| 5,769,365 A | 6/1998 | Onishi |
| 5,784,847 A | 7/1998 | Wiklund |
| 5,852,904 A | 12/1998 | Yu et al. |
| 5,857,292 A | 1/1999 | Simpson |
| 5,875,592 A | 3/1999 | Allman et al. |
| 5,880,544 A | 3/1999 | Ikeda |
| 5,885,154 A | 3/1999 | Napadow et al. |
| 5,941,767 A | 8/1999 | Fukuda et al. |
| 5,969,292 A | 10/1999 | Snider et al. |
| 6,034,873 A | 3/2000 | Stahl et al. |
| 6,079,941 A | 6/2000 | Lee |
| 6,129,316 A | 10/2000 | Bauer |
| 6,224,016 B1 | 5/2001 | Lee et al. |
| 6,231,704 B1 | 5/2001 | Carpinetti |
| 6,301,853 B1 | 10/2001 | Simpson et al. |
| 6,365,830 B1 | 4/2002 | Snider, Jr. |
| 6,374,627 B1 | 4/2002 | Schumacher |
| 6,394,398 B1 | 5/2002 | Reed |
| 6,407,533 B1 | 6/2002 | Bartek et al. |
| 6,412,260 B1 | 7/2002 | Lukac |
| 6,412,292 B2 | 7/2002 | Spinazzola et al. |
| 6,427,454 B1 | 8/2002 | West |
| 6,437,243 B1 | 8/2002 | VanderVelde |
| 6,453,055 B1 | 9/2002 | Fukumura et al. |
| 6,481,527 B1 | 11/2002 | French et al. |
| 6,506,110 B1 | 1/2003 | Borisch |
| 6,535,382 B2 | 3/2003 | Bishop et al. |
| 6,541,704 B1 | 4/2003 | Levenson et al. |
| 6,566,775 B1 | 5/2003 | Fradella |
| 6,567,769 B2 | 5/2003 | Chang |
| 6,574,970 B2 | 6/2003 | Spinazzola et al. |
| 6,592,448 B1 | 7/2003 | Williams |
| 6,616,524 B2 | 9/2003 | Storck et al. |
| 6,672,955 B2 | 1/2004 | Charron |
| 6,707,688 B2 | 3/2004 | Reyes et al. |
| 6,722,151 B2 | 4/2004 | Spinazzola et al. |
| 6,742,942 B2 | 6/2004 | Hering et al. |
| 6,745,579 B2 | 6/2004 | Spinazzola et al. |
| 6,794,777 B1 | 9/2004 | Fradella |
| 6,817,688 B2 | 11/2004 | O'Halloran |
| 6,822,859 B2 | 11/2004 | Coglitore et al. |
| 6,824,150 B2 | 11/2004 | Simione |
| 6,833,991 B2 | 12/2004 | Van Gaal |
| 6,846,132 B2 | 1/2005 | Kennedy et al. |
| 6,848,267 B2 | 2/2005 | Pierson |
| 6,859,366 B2 | 2/2005 | Fink et al. |
| 6,862,179 B2 | 3/2005 | Beitelmal et al. |
| 6,867,967 B2 | 3/2005 | Mok |
| 6,897,587 B1 | 5/2005 | McMullen |
| 6,957,670 B1 | 10/2005 | Kajino |
| 6,967,283 B2 | 11/2005 | Rasmussen et al. |
| 6,980,433 B2 | 12/2005 | Fink et al. |
| 6,981,915 B2 | 1/2006 | Moore et al. |
| 7,003,374 B2 | 2/2006 | Olin et al. |
| 7,033,267 B2 | 4/2006 | Rasmussen et al. |
| 7,042,722 B2 | 5/2006 | Suzuki et al. |
| 7,061,715 B2 | 6/2006 | Miyamoto |
| 7,100,827 B2 | 9/2006 | Olin et al. |
| 7,187,265 B1 | 3/2007 | Senogles et al. |
| 7,232,236 B2 | 6/2007 | Vitense et al. |
| 7,278,273 B1 | 10/2007 | Witted |
| 7,315,448 B1 | 1/2008 | Bash et al. |
| 7,369,741 B2 | 5/2008 | Reagan et al. |
| 7,372,695 B2 | 5/2008 | Coglitore |
| 7,430,118 B1 | 9/2008 | Noteboom et al. |
| 7,448,945 B2 | 11/2008 | Bessent |
| 7,477,514 B2 | 1/2009 | Campbell et al. |
| 7,486,511 B1 | 2/2009 | Griffel et al. |
| 7,500,911 B2 | 3/2009 | Johnson et al. |
| 7,505,849 B2 | 3/2009 | Saarikivi |
| 7,508,663 B2 | 3/2009 | Coglitore et al. |
| 7,511,959 B2 | 3/2009 | Belady |
| 7,542,287 B2 | 6/2009 | Lewis et al. |
| 7,568,360 B1 | 8/2009 | Bash et al. |
| 7,574,839 B1 | 8/2009 | Simpson |
| 7,604,535 B2 | 10/2009 | Germagian et al. |
| 7,641,546 B2 | 1/2010 | Bok et al. |
| 7,656,660 B2 | 2/2010 | Hoeft |
| 7,667,965 B2 | 2/2010 | Nobile |
| 7,675,747 B1 | 3/2010 | Ong et al. |
| 7,684,193 B2 | 3/2010 | Fink et al. |
| 7,688,578 B2 | 3/2010 | Mann et al. |
| 7,778,030 B1 | 8/2010 | Chiriac |
| 7,787,260 B2 | 8/2010 | Hruby et al. |
| 7,789,359 B2 | 9/2010 | Chopp et al. |
| 7,804,685 B2 | 9/2010 | Krietzman et al. |
| 7,804,690 B2 | 9/2010 | Huang et al. |
| 7,862,410 B2 | 1/2011 | McMahan et al. |
| 7,881,910 B2 | 2/2011 | Rasmussen et al. |
| 7,894,190 B2 | 2/2011 | Davis et al. |
| 7,903,407 B2 | 3/2011 | Matsushima et al. |
| 7,954,070 B2 | 5/2011 | Plocher et al. |
| 7,957,139 B2 | 6/2011 | Davis et al. |
| 7,971,446 B2 | 7/2011 | Clidaras |
| 8,037,644 B2 | 10/2011 | Hall |
| 8,040,673 B2 | 10/2011 | Krietzman |
| 8,061,087 B2 | 11/2011 | Ray |
| 8,072,780 B1 | 12/2011 | Roy |
| 8,113,010 B2 | 2/2012 | Carlson |
| 8,144,467 B2 | 3/2012 | Campbell et al. |
| 8,159,820 B2 | 4/2012 | Ibori et al. |
| 8,180,495 B1* | 5/2012 | Roy ............... H05K 7/20745 165/67 |
| 8,209,993 B2 | 7/2012 | Carlson et al. |

(56) References Cited

U.S. PATENT DOCUMENTS

| | | |
|---|---|---|
| 8,223,495 B1 | 7/2012 | Carlson et al. |
| 8,257,155 B2 | 9/2012 | Lewis |
| 8,276,397 B1 | 10/2012 | Carlson et al. |
| 8,282,451 B2 | 10/2012 | Taylor |
| 8,300,410 B2 | 10/2012 | Slessman |
| 8,469,782 B1 | 6/2013 | Roy |
| 8,493,732 B2 | 7/2013 | Lineal et al. |
| 8,498,114 B2 | 7/2013 | Martini |
| 8,514,572 B2 | 8/2013 | Rogers |
| 8,553,409 B2 | 10/2013 | Rehmann et al. |
| 8,705,233 B2 | 4/2014 | Rehmann et al. |
| 8,806,238 B2 | 8/2014 | Jau |
| 8,824,142 B2 | 9/2014 | Jewell-Larsen et al. |
| 9,363,925 B2 | 6/2016 | Czamara |
| 2001/0029163 A1 | 10/2001 | Spinazzola et al. |
| 2002/0005457 A1 | 1/2002 | Lee et al. |
| 2002/0059804 A1 | 5/2002 | Spinazzola et al. |
| 2002/0108386 A1 | 8/2002 | Spinazzola et al. |
| 2002/0121555 A1 | 9/2002 | Cipolla et al. |
| 2003/0050003 A1 | 3/2003 | Charron |
| 2003/0066638 A1 | 4/2003 | Qu |
| 2003/0122379 A1 | 7/2003 | Woods |
| 2003/0124971 A1 | 7/2003 | Williams |
| 2003/0143942 A1 | 7/2003 | Kennedy et al. |
| 2003/0181158 A1 | 9/2003 | Schell et al. |
| 2003/0183955 A1 | 10/2003 | Fields |
| 2003/0209023 A1 | 11/2003 | Spinazzola et al. |
| 2003/0231881 A1 | 12/2003 | Hering et al. |
| 2004/0004813 A1 | 1/2004 | Coglitore et al. |
| 2004/0050231 A1* | 3/2004 | Chu ................ H05K 7/2079 83/574 |
| 2004/0099747 A1 | 5/2004 | Johnson et al. |
| 2004/0118137 A1 | 6/2004 | Patel et al. |
| 2004/0148934 A1 | 8/2004 | Pinkerton |
| 2004/0218355 A1 | 11/2004 | Bash et al. |
| 2005/0024826 A1* | 2/2005 | Bash ................ G06F 1/20 361/695 |
| 2005/0034468 A1 | 2/2005 | Dietz |
| 2005/0099770 A1 | 5/2005 | Fink |
| 2005/0167135 A1 | 8/2005 | Jackson |
| 2005/0170770 A1 | 8/2005 | Johnson et al. |
| 2005/0185363 A1 | 8/2005 | Rasmussen et al. |
| 2005/0225936 A1 | 10/2005 | Day |
| 2005/0246057 A1 | 11/2005 | Olin et al. |
| 2005/0246132 A1 | 11/2005 | Olin et al. |
| 2005/0278070 A1 | 12/2005 | Bash et al. |
| 2006/0021786 A1 | 2/2006 | Fetterolf et al. |
| 2006/0026954 A1 | 2/2006 | Truong |
| 2006/0055175 A1 | 3/2006 | Grinblat |
| 2006/0056127 A1 | 3/2006 | Lewis |
| 2006/0066163 A1 | 3/2006 | Melfi |
| 2006/0072277 A1 | 4/2006 | Schmidt et al. |
| 2006/0082263 A1 | 4/2006 | Rimler et al. |
| 2006/0146520 A1 | 7/2006 | Vitense et al. |
| 2006/0158037 A1 | 7/2006 | Danley |
| 2006/0185931 A1 | 8/2006 | Kawar |
| 2006/0187636 A1 | 8/2006 | Fink et al. |
| 2006/0236487 A1 | 10/2006 | Dean |
| 2006/0260338 A1 | 11/2006 | Van Gilder et al. |
| 2006/0276121 A1 | 12/2006 | Rasmussen et al. |
| 2006/0277501 A1 | 12/2006 | Plocher et al. |
| 2006/0281061 A1 | 12/2006 | Hightower |
| 2007/0021050 A1 | 1/2007 | Kennedy |
| 2007/0032979 A1 | 2/2007 | Hamann et al. |
| 2007/0040263 A1 | 2/2007 | Towada |
| 2007/0064389 A1 | 3/2007 | Lewis, II et al. |
| 2007/0078635 A1 | 4/2007 | Rasmussen et al. |
| 2007/0082195 A1 | 4/2007 | Goecke et al. |
| 2007/0094946 A1 | 5/2007 | Schoeny |
| 2007/0105445 A1 | 5/2007 | Manto et al. |
| 2007/0129000 A1 | 6/2007 | Rasmussen et al. |
| 2007/0135032 A1* | 6/2007 | Wang ................ F24F 9/00 454/184 |
| 2007/0146994 A1* | 6/2007 | Germagian ........ H05K 7/20745 361/695 |
| 2007/0171613 A1 | 7/2007 | McMahan et al. |
| 2007/0211443 A1 | 9/2007 | Wechter et al. |
| 2007/0213000 A1 | 9/2007 | Day |
| 2007/0243425 A1 | 10/2007 | Spaner |
| 2007/0253181 A1 | 11/2007 | Bersiek |
| 2007/0267247 A1 | 11/2007 | Tartsch |
| 2007/0274043 A1 | 11/2007 | Shabay |
| 2008/0029250 A1 | 2/2008 | Carlson et al. |
| 2008/0035810 A1 | 2/2008 | Lewis |
| 2008/0055848 A1 | 3/2008 | Hamburgen et al. |
| 2008/0055850 A1 | 3/2008 | Carlson et al. |
| 2008/0094797 A1 | 4/2008 | Coglitore |
| 2008/0137266 A1 | 6/2008 | Jensen |
| 2008/0198549 A1* | 8/2008 | Rasmussen ........ H05K 7/2079 361/696 |
| 2008/0264688 A1 | 10/2008 | Chopp et al. |
| 2008/0266794 A1* | 10/2008 | Malone ............ H05K 7/20745 361/695 |
| 2008/0299890 A1 | 12/2008 | Orrell |
| 2008/0305733 A1 | 12/2008 | Noteboom et al. |
| 2009/0051545 A1 | 2/2009 | Koblasz |
| 2009/0061756 A1 | 3/2009 | Germagian et al. |
| 2009/0064551 A1 | 3/2009 | Schroder et al. |
| 2009/0195977 A1 | 8/2009 | Fink et al. |
| 2009/0197684 A1 | 8/2009 | Arezina et al. |
| 2009/0228726 A1 | 9/2009 | Malik |
| 2009/0229510 A1 | 9/2009 | Sutter |
| 2009/0235097 A1 | 9/2009 | Hamilton |
| 2009/0239460 A1 | 9/2009 | Luciat et al. |
| 2009/0239461 A1 | 9/2009 | Lewis et al. |
| 2009/0241578 A1* | 10/2009 | Carlson ............ F25D 17/06 62/259.2 |
| 2009/0277605 A1 | 11/2009 | Vangilder et al. |
| 2009/0308579 A1 | 12/2009 | Johnson et al. |
| 2009/0319650 A1 | 12/2009 | Collins |
| 2009/0326721 A1* | 12/2009 | Sugiyama ............ F24F 11/0001 700/282 |
| 2010/0003911 A1 | 1/2010 | Graczyk et al. |
| 2010/0016730 A1 | 1/2010 | Tanaka et al. |
| 2010/0048119 A1* | 2/2010 | Tashiro .............. H05K 7/20745 454/184 |
| 2010/0061057 A1* | 3/2010 | Dersch ............. H05K 7/20745 361/690 |
| 2010/0061059 A1 | 3/2010 | Krietzman et al. |
| 2010/0110626 A1 | 5/2010 | Schmitt et al. |
| 2010/0136895 A1* | 6/2010 | Sgro ................. H05K 7/20836 454/184 |
| 2010/0139887 A1* | 6/2010 | Slessman ............ F28F 9/0265 165/67 |
| 2010/0144265 A1 | 6/2010 | Bednarcik et al. |
| 2010/0151781 A1 | 6/2010 | Slessman et al. |
| 2010/0154448 A1 | 6/2010 | Hay |
| 2010/0165565 A1 | 7/2010 | Hellriegal et al. |
| 2010/0165572 A1* | 7/2010 | Fink .................. H05K 7/20 361/695 |
| 2010/0170277 A1 | 7/2010 | Schmitt et al. |
| 2010/0187832 A1 | 7/2010 | Holland |
| 2010/0190430 A1* | 7/2010 | Rodriguez ......... H05K 7/20745 454/184 |
| 2010/0201230 A1 | 8/2010 | Schweitzer et al. |
| 2010/0216388 A1 | 8/2010 | Tresh et al. |
| 2010/0223085 A1 | 9/2010 | Gauthier et al. |
| 2010/0223800 A1 | 9/2010 | Morrison et al. |
| 2010/0245083 A1 | 9/2010 | Lewis |
| 2010/0248609 A1* | 9/2010 | Tresh ................ H05K 7/20745 454/184 |
| 2010/0248610 A1 | 9/2010 | Caveney et al. |
| 2010/0267325 A1 | 10/2010 | Matser et al. |
| 2010/0304657 A1 | 12/2010 | Gallmann et al. |
| 2010/0314849 A1 | 12/2010 | Realegeno-Amaya |
| 2010/0328889 A1 | 12/2010 | Campbell et al. |
| 2011/0009047 A1* | 1/2011 | Noteboom ......... H05K 7/20745 454/184 |
| 2011/0014862 A1 | 1/2011 | Honold et al. |
| 2011/0031071 A1 | 2/2011 | Takeuchi |
| 2011/0078480 A1 | 3/2011 | Calo et al. |
| 2011/0094978 A1 | 4/2011 | Bailey et al. |
| 2011/0105010 A1 | 5/2011 | Day |

(56) References Cited

U.S. PATENT DOCUMENTS

| | | |
|---|---|---|
| 2011/0122570 A1 | 5/2011 | Beck et al. |
| 2011/0143644 A1 | 6/2011 | McMahan et al. |
| 2011/0156480 A1 | 6/2011 | Park |
| 2011/0157829 A1 | 6/2011 | Wormsbecher et al. |
| 2011/0189936 A1 | 8/2011 | Haspers et al. |
| 2011/0195652 A1* | 8/2011 | Smith ............... F24F 11/008 454/184 |
| 2011/0232209 A1 | 9/2011 | Boersema |
| 2011/0239679 A1 | 10/2011 | Dechene et al. |
| 2011/0239681 A1* | 10/2011 | Ziegler ............... E04H 5/02 62/259.2 |
| 2011/0239683 A1* | 10/2011 | Czamara ............ H05K 7/20745 62/259.4 |
| 2011/0306288 A1 | 12/2011 | Murayama |
| 2012/0012283 A1* | 1/2012 | Bean, Jr. ............ H05K 7/20745 165/104.33 |
| 2012/0014060 A1* | 1/2012 | Slessman ........... H05K 7/20736 361/691 |
| 2012/0014061 A1 | 1/2012 | Slessman |
| 2012/0018966 A1 | 1/2012 | Moore et al. |
| 2012/0031585 A1 | 2/2012 | Salpeter |
| 2012/0041569 A1 | 2/2012 | Zhang |
| 2012/0147552 A1* | 6/2012 | Driggers ............. G06F 1/183 361/679.53 |
| 2012/0162906 A1* | 6/2012 | Jai ................... H05K 7/20745 361/679.53 |
| 2012/0167600 A1* | 7/2012 | Dunnavant ......... F24F 12/006 62/89 |
| 2012/0229972 A1* | 9/2012 | Bean, Jr. ............ H05K 7/20745 361/679.46 |
| 2012/0255710 A1* | 10/2012 | Maselli .............. H05K 7/1497 165/80.2 |
| 2012/0276834 A1 | 11/2012 | Peng et al. |
| 2012/0281357 A1 | 11/2012 | Peng et al. |
| 2012/0297807 A1 | 11/2012 | Canney et al. |
| 2012/0300391 A1* | 11/2012 | Keisling ............. H05K 7/20745 361/679.46 |
| 2012/0300398 A1 | 11/2012 | Eckberg et al. |
| 2012/0327592 A1 | 12/2012 | Godrich et al. |
| 2012/0331317 A1 | 12/2012 | Rogers |
| 2013/0148291 A1 | 6/2013 | Slessman |
| 2013/0340361 A1 | 12/2013 | Rogers |
| 2014/0128351 A1 | 5/2014 | Somani et al. |
| 2014/0211411 A1* | 7/2014 | Slaby ................. H05K 7/20745 361/679.46 |
| 2014/0254089 A1* | 9/2014 | Eichelberg ......... H05K 5/0213 361/679.46 |

OTHER PUBLICATIONS

Intel, publication date, if any, unknown, "Air-Cooled High-Performance Data Centers: Case Studies and Best Methods", white paper, dated Nov. 2006, pp. 1-20.

* cited by examiner

DATA CENTER FACILITY DESIGN CONFIGURATION

RELATED APPLICATIONS

This application is a continuation of U.S. patent application Ser. No. 13/815,911 filed Mar. 15, 2013, and is hereby incorporated by reference in its entirety.

FIELD OF THE RELATED ART

This application relates generally to data centers, and more particularly to a configuration for a data center.

BACKGROUND

Organizations of all types, such as on-line retailers, Internet service providers, search providers, financial institutions, universities, and other computing-intensive organizations, conduct computer operations from large scale computing facilities. Such computing facilities, often referred to as data centers, house and accommodate a large amount of server, network, and computer equipment to process, store, and exchange data as needed to carry out an organization's operations. Typically, a data center includes many server racks, each of which may include many servers and associated computer equipment. Information Technology (IT) operations are a crucial aspect of most organizational operations. One of the main concerns is business continuity—companies rely on their information systems to run their operations. If a system becomes unavailable, company operations may be impaired or stopped completely. It is necessary therefore to provide a reliable infrastructure for IT operations in order to minimize any chance of disruption.

Further, because a data center may contain a large number of servers that include many electrical components, a large amount of electrical power may be required to operate the facility. The electrical power is distributed to a large number of locations spread throughout the computer room (e.g., many racks spaced from one another, and many servers in each rack). Electronic components in computer systems such as integrated circuits, printed circuit boards, mass storage devices, power supplies, processors, etc. generate excess heat. As an example, computers with multiple processors may generate 250 watts of waste heat. Multiply that figure by several thousand (or tens of thousands) to account for the amount of computers in a large data center, and one can readily appreciate the amount of heat that can be generated. A plurality of larger, multiple-processor computers configured into rack-mounted components within a racking system can generate a substantial amount of waste heat. To remedy this, data centers include mechanisms for waste heat removal from a plurality of racking systems, typically by circulating air through one or more of the rack systems. Many data centers therefore rely on air conditioning systems to maintain the temperature and other environmental conditions in the data center within acceptable limits.

A data center must maintain high standards for assuring the integrity and functionality of its hosted computer environment. This is generally accomplished through robust design and redundancy, including redundancy of processing resources, communication channels, as well as power and emergency backup power generation.

One example of a robust design and redundancy is described in U.S. Pat. No. 8,180,495, assigned to the same assignee as the present invention, and which is incorporated by reference in its entirety. FIG. 1 herein illustrates the configuration of described in the '495 patent of the facility 580, with exterior walls 582, with condenser units 800 and heat expulsion chambers 900 exterior of the facility 580, and data equipment areas 586, with cabinet clusters 590 therein. Power PDUs are located within the equipment area 588, with other equipment in areas 584. While this overall configuration is efficient, further advantageous refinements have been made, which are disclosed herein, though for aspects that are similar, those are apparent and will not be repeated in the disclosure herein.

SUMMARY

The methods and apparatuses described herein is a data center.

In one embodiment is described a data center comprising: a building having a plurality of rooms and first and second exterior load walls disposed on opposite sides of the building; a plurality of air handler and fluid cooler devices disposed exterior to the building along the first exterior load wall; a plurality of condenser unit devices disposed exterior to the building along the second exterior load wall; a data sector disposed inside the building, adjacent to the first exterior load wall; three separate UPS and substation distribution equipment rooms, each containing UPS and substation distribution equipment therein, as well as air conditioning equipment that is connected to certain of the plurality of condenser unit devices; and a power spine room disposed between the three separate UPS and substation distribution equipment rooms and the data sector, the power spine room including a plurality of PDU devices.

BRIEF DESCRIPTION OF THE DRAWINGS

These and other aspects and features will become apparent to those ordinarily skilled in the art upon review of the following description of specific embodiments of the invention in conjunction with the accompanying figures, in which.

DETAILED DESCRIPTION

For the purposes of explanation, numerous specific details are set forth throughout this description in order to provide a thorough understanding. It will be appreciated, however, by persons skilled in the art that the embodiments described herein may be practiced without some of these specific details. In other instances, well-known structures and devices are shown in block diagram form to avoid obscuring the underlying principles of the various embodiments.

Figure 1:
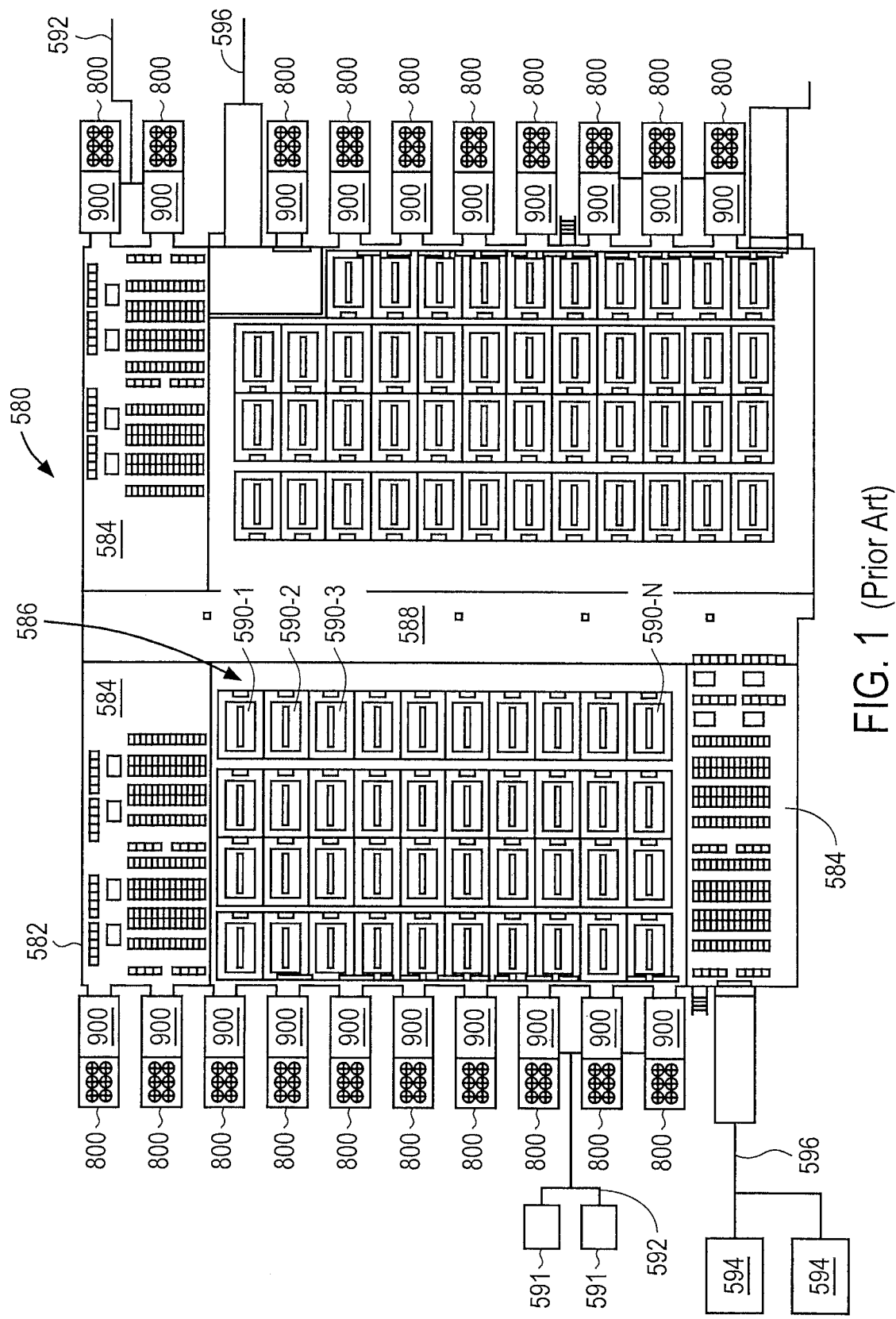
FIG. 1 depicts an example of a prior art data center configuration.
Figure 2:
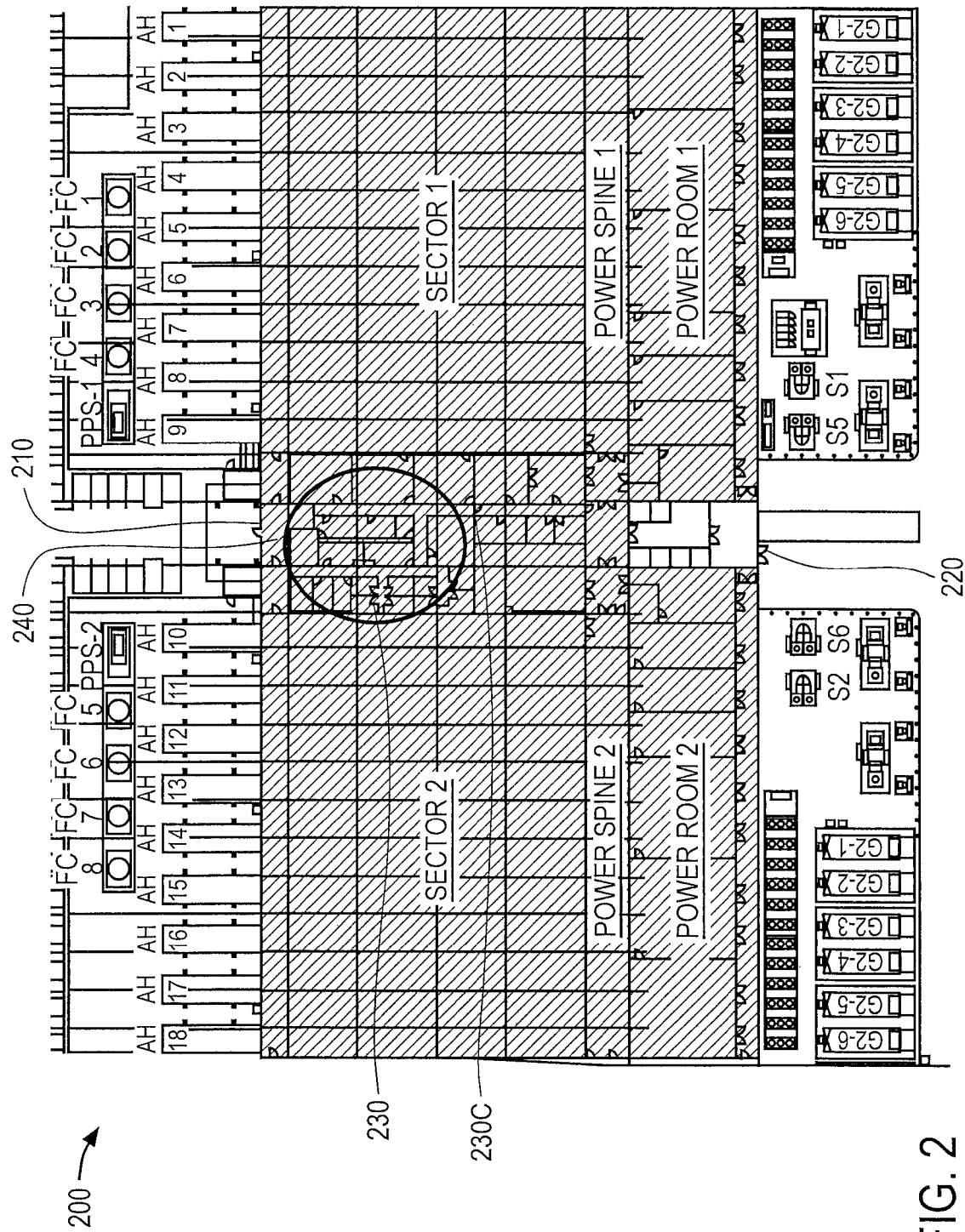
FIG. 2 depicts an overview of a data center configuration according to one embodiment.

The methods and apparatuses described herein include a data center. FIG. 2 depicts an overview of a data center configuration according to one embodiment. As illustrated, the data center 200 includes different rooms, each of which have different intended purposes. It will be apparent from FIG. 2 that in a preferred embodiment there is a symmetric design, in which there is a Sector 1 and a Sector 2, each of which are for the data hall portion of the building that stores a plurality of cabinets of electronic equipment. As is apparent the right portion of the building that includes Sector 1 and the left portion of the building that contains Sector 2 are symmetric about the centerline of the building. As such, the following discussion will focus on Sector 1, with it being understood that the Sector 2 area is identical.

Each of Sector 1, Power Spine 1, Power Room 1 (which has 6 different separately locked rooms therein, as well as the customer entry area 210, the equipment shipping dock 220 and a customer facing conference area 230 are each individual rooms, with no access between them unless through locked doors (including in the corridor marked at 230C), sometime multiple locked doors as indicated, particularly at the secure mantrip 230 through which access to the Sector 1 from the customer entry area 210 can be gained, upon permission from security personnel preferably located in the security entry room 240. Of course access to the entire facility is strictly controlled and any visitor entrance is confined to a single locked door, with one-time exceptions for shipping products received at the shipping dock discussed below that is also locked and monitored. Employee entrance is also through another single locked door.

All entrances, doors, as well as overall areas are further under video surveillance in a preferred embodiment.

It is further noted that each of the each of the 6 different separately locked rooms within Power Room 1 are bounded by reinforced concrete, as within each of these rooms is distribution power equipment. In a failure of the equipment in those rooms, the reinforced concrete walls will protect the data equipment I Sector 1.

It is further noted that above the entire structure is preferably a reinforced roof, as described in U.S. application Ser. No. 13/651,303, the contents of which are expressly incorporated by reference.

Figure 3:
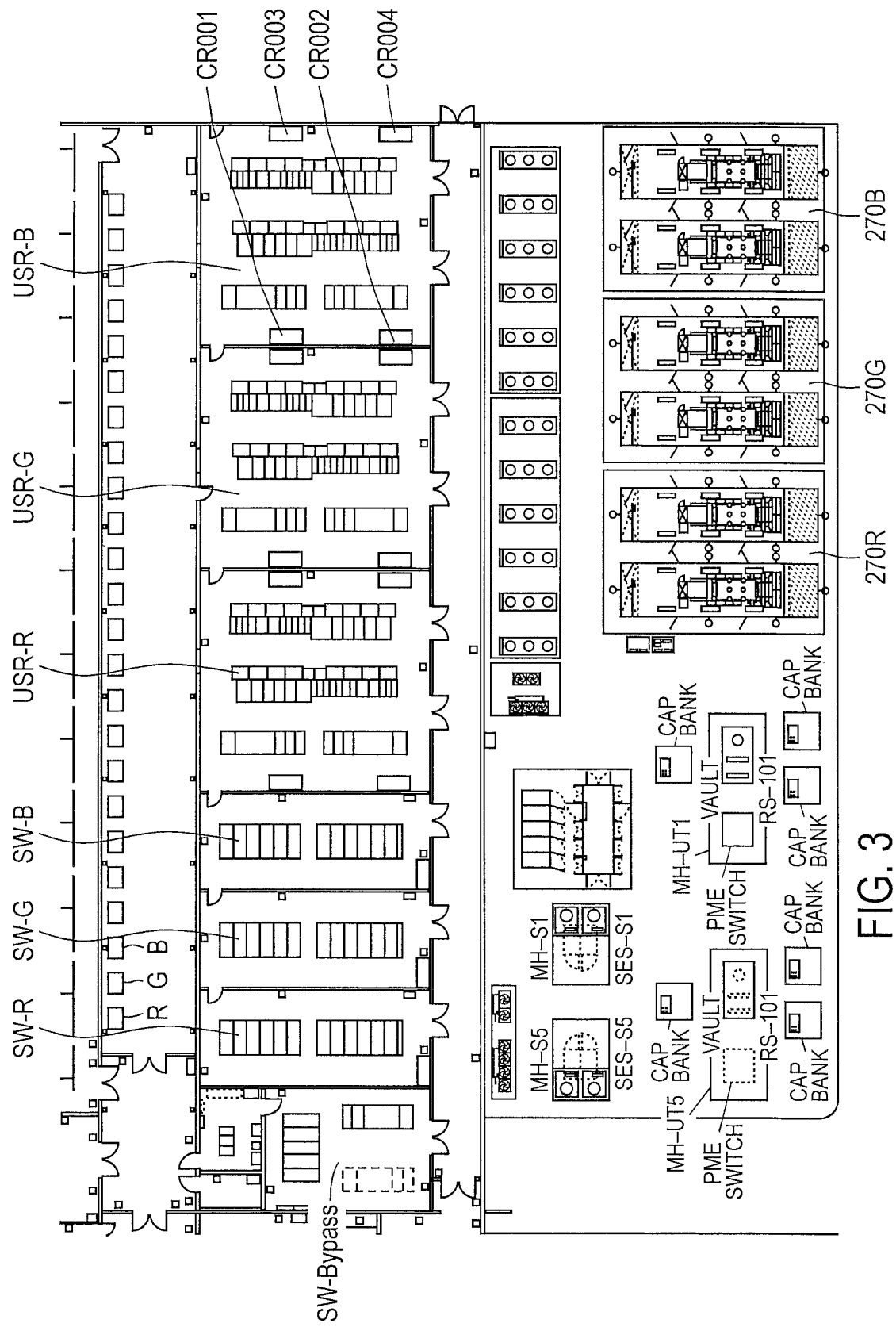
FIG. 3 depicts a more detailed view of a distribution equipment area of the data center configuration set forth in FIG. 2 according to one embodiment.
Figure 4:
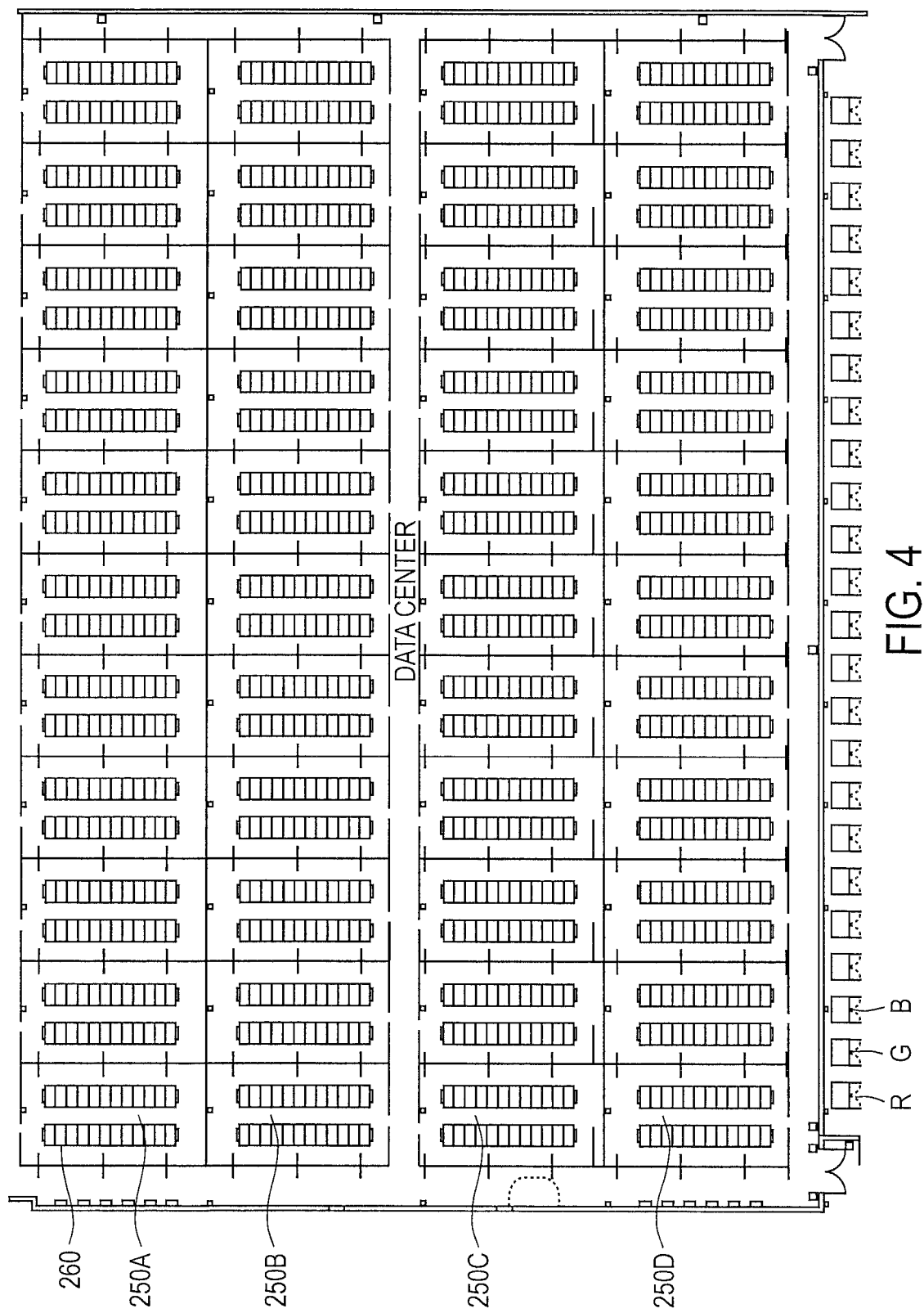
FIG. 4 depicts a more detailed view of a data equipment area of the data center configuration set forth in FIG. 2 according to one embodiment.

It is also noted that within the Sector 1, a more detailed diagram of which is shown in FIG. 4, the preferred design of the room includes the bracket support designs that are taught in U.S. application Ser. No. 13/551,415, the contents of which are expressly incorporated by reference. With respect to running the tri-redundant RGB Power disclosed in FIG. 7B of the '495 patent, using the bracket support design in U.S. application Ser. No. 13/551,415, the power produced from the leftmost three PDU's shown as R, G B in FIG. 4 are all distributed to the cabinet clusters in the overhead manner along the paths 260. As there are 24 PDU's and 12 paths 260 in the preferred embodiment, various arrangements of running 3 redundant PDU transmission lines overhead along each path 260 are possible. Which arrangement to use can vary, such as depending upon the energy consumption of various equipment within each of the cabinet clusters 260. It is apparent that the row of PDU's in FIG. 3 and FIG. 4 are the same as in FIG. 2, though given the smaller size of FIG. 2 they PDU's are not shown there.

Turning back to FIG. 2, and with reference to FIG. 3 which is more detailed diagram of the distribution equipment rooms within Power Room 1, as well as other equipment disposed on the ground level exterior to the building in the preferred embodiment, it is apparent that there are 3 power switching rooms SW-R, SW-G, SW-B, as well as three UPS and substation rooms USR-R, USR-G, USR-B, with the three switching rooms and the three UPS and substation rooms being identical. As such aspect of these rooms will be discussed only with respect to one of them, as it is the same for the other redundant two. It is noted that there is also bypass switching room SW-bypass, which can be used if repairs are needed for equipment in each of switching rooms SW-R, SW-G, SW-B.

As to the switching rooms SW-R, SW-G, SW-B, backup diesel generators (270R, 270G, 270B) exist external to the building. Preferably underground power lines from the backup diesel generators (270R, 270G, 270B) protrude through the floor of each of the switching rooms SW-R, SW-G, SW-B, allowing for the switching in of redundant power if needed.

As to the UPS and substation rooms USR-R, USR-G, USR-B, within each room, in addition to the UPS and substation equipment, are four different CRAC 1-4 air conditioning units, which have their condensers 280 in the exterior of the building, with the coolant running preferably underground into the rooms and into the four different CRAC 1-4 air conditioning units.

In the present design, all of the condenser units FC and air handling units AH are disposed outside of only one exterior wall, though are otherwise the same as described in the '495 patent. This difference, however, along with the Power Spine 1 being along the opposite edge of the Sector 1 is intentional, as this allows the condensers 280 to be located external to the building, but in spaced relation to the CRAC units that are within the UPS and substation rooms USR-R, USR-G, USR-B.

It is noted that while no equipment using water is disposed within the Sector 1 (other than as required by fire regulations), the reason for this is due to the damage that could be caused to the equipment in the cabinet clusters. As to the distribution rooms, however, usage of the CRAC-1-4 units having the external condensers is more efficient due to the high thermal energy generated within them, as well as given the concrete reinforced walls that would ensure that any coolant leakage from a CRAC-1-4 unit is maintained within the UPS and substation room, as there are a minimum number of doors from those UPS and substation rooms to the Power Spine.

Security is another aspect that is significant, and by having different customer areas, distribution equipment areas, as well as cabinet cluster areas, personnel that work on equipment in the various areas (which is of different type and thus requiring different personnel) are maintained in their respective areas Although described with reference to the preferred embodiments thereof, it will be readily apparent to those of ordinary skill in the art that modifications in the form and details of the disclosed embodiments can be made without departing from the spirit and scope thereof. Further, embodiments disclosed herein may include various operations as set forth above, or fewer or more operations; or operations in an order different from the order described. Accordingly, the scope should be judged in terms of the claims which follow as well as the legal equivalents thereof.

What is claimed is:

1. A data center comprising:
 a building having a first exterior load wall and a second exterior load wall, the first exterior load wall disposed on an opposite side of the building than the second exterior load wall;
 a plurality of rooms inside the building, the rooms comprising:
  a data sector room disposed inside the building, the data sector room configured to house data processing devices;
  three separate UPS and substation distribution equipment rooms disposed inside the building, each containing UPS and substation distribution equipment, and air conditioning equipment that is connected to certain of the plurality of condenser unit devices; and a power spine room disposed between the three separate UPS and substation distribution equipment rooms and the data sector, the power spine room including a plurality of PDU devices, configured to receive power;

three separate power switching rooms disposed inside the building, each power switching room containing power switching equipment configured to supply power to the power spine room and further configured to switch to a redundant power source to supply power from the redundant power source to the power spine room;

a plurality of air handler and fluid cooler devices disposed exterior to the building; and a plurality of condenser unit devices disposed exterior to the building.

2. The data center of claim 1 wherein the plurality of air handler and fluid cooler devices are disposed exterior to the building along the first exterior load wall and the plurality of condenser unit devices are disposed exterior to the building along the second exterior load wall.

3. The data center of claim 1 wherein the redundant power source is a backup generator.

4. The data center of claim 1 wherein the redundant power source is a first backup generator, a second backup generator and a third backup generator, each of the three generators associated with one of the three power switching rooms.

5. The data center of claim 1 further comprising a plurality of cabinet clusters configured to accept placement of a plurality of rows of cabinets therein, the cabinet clusters separating the cabinets by a hot aisle, each cabinet cluster further including a hot aisle containment chamber, generally aligned with and above the hot aisle, that opens into a hot air plenum cavity such that hot air upwardly moves into each of the hot aisles and into the hot air return plenum cavity that is physically separated from the data sector therebelow by a data sector ceiling.

6. The data center of claim 5 further comprising an interior frame that suspends the hot aisle containment chambers above a corresponding cabinet cluster, the interior frame structure is independent of and not structurally tied to any cabinets located within each cabinet cluster.

7. The data center of claim 6 further comprising a plurality of cooling vents disposed below the data sector ceiling, the plurality of cooling vents supported by the interior frame structure.

8. The data center of claim 7 wherein the interior frame structure includes a plurality of support brackets.

9. The data center of claim 8 wherein the interior frame structure includes a plurality of horizontal support brackets disposed above a cabinet height that each intersect a middle hot aisle portion of a plurality of adjacent cabinet clusters.

10. The data center of claim 9 wherein the interior frame structure includes for each cabinet cluster:

a first plurality of vertical support brackets disposed along each of the two rows, each vertical support bracket having a first end and a second end, the first end attached to a floor and the second end supporting a thermal barrier ceiling, and the first plurality of vertical support brackets also connected to and supporting a thermal shield on one side of the first plurality of vertical support brackets, the thermal shield at a location above a top of the plurality of cabinets:

a plurality of tiered ladder rack supports, which establish a plurality of different tiers outside of the hot air containment chamber, the different tiers configured to support electronic equipment power wires and conduits and the communication wiring; and a second plurality of vertical support brackets arranged in a row, the second plurality of vertical support brackets having a first end and a second end, the first end attached to the floor and the second end supporting the thermal barrier ceiling, the second plurality of vertical support brackets also connected to and supporting portions of the cool air ductwork.

11. The data center of claim 7 wherein the interior frame structure includes for each cabinet cluster: a first plurality of vertical support brackets disposed along each of the two rows, each vertical support bracket being disposed on the floor at one end and assists in supporting the thermal barrier ceiling at another end, wherein the first plurality of vertical support brackets each further support portions of the thermal shield on one side of the first plurality of vertical support brackets at a location above a top of the plurality of cabinets; a plurality of tiered ladder rack supports, each connected to another side of at least some of the first plurality of vertical support brackets that is opposite the one side, which establish a plurality of different tiers outside of the hot air containment chamber, so that each of the different tiers is adapted to hold the electronic equipment power wires and conduits and the communication wiring, and a plurality of conduit holders for holding a plurality of the distribution power wires and conduits, each of the plurality of conduit holders connected to another side of at least some of the first plurality of vertical support brackets that is opposite the one side, each of the plurality of conduit holder disposed above the plurality of tiered ladder rack supports, each of the plurality of conduit holders being aligned with other ones of the plurality of conduit holders; and a second plurality of vertical support brackets disposed in a row, substantially parallel to the two rows, each second vertical support bracket being disposed on the floor at one end and assists in supporting the thermal barrier ceiling at another end, wherein the second plurality of vertical support brackets each further support portions of the cool air ductwork.

12. The data center of claim 5 wherein the hot air plenum cavity includes an opening associated with the plurality of air handler and fluid cooler devices disposed exterior to the building, wherein the openings are disposed along and through an exterior load wall; and further comprising at least one fan located on an opposite wall of the hot air plenum cavity that fan configured to push hot air located within the hot air plenum cavity toward the openings in the exterior load wall.

13. The data center of claim 5 further comprising a two or more of independent roofs located above the hot air plenum cavity.

14. The data center of claim 1 wherein the power spine completely separates the data sector from the three separate power switching rooms and the three separate UPS and substation distribution equipment rooms.

15. The data center of claim 14 further comprising a common wall separating each of the three separate power switching rooms and the power spine room, the common wall having no doors.

16. The data center of claim 15 further comprising a common wall separating the three separate UPS and substation distribution equipment rooms and the power spine room, such that only one door exists within the common wall between the three separate UPS and substation distribution equipment rooms and the power spine room.

17. The data center of claim 15 further comprising a common wall between the data sector and the power spine room, the common wall between the data sector and the power spine room having no doors.

18. The data center of claim 16 further comprising an access hall that provides a path of entry into the three separate power switching rooms and the three separate UPS and substation distribution equipment rooms, the access hall separating the three separate power switching rooms and the three separate UPS and substation distribution equipment rooms on one side and an exterior wall on the other side.

19. The data center of claim 1 further comprising air conditioning equipment that is connected to one or more of the plurality of condenser units, such that coolant is passed underground between the air conditioning equipment and the one or more of the plurality of condenser units.

20. The data center of claim 1 further comprising a backup power generator that is located exterior to the building, the backup power generator connected to the power switching equipment by underground power lines.

21. The data center of claim 1 wherein the data sector contains no running water other than as required for compliance with fire regulations.

22. A data center comprising:
   a building having a plurality of rooms inside the building, the rooms comprising:
   a data sector room inside the building to house data processing devices;
   three separate UPS and substation distribution equipment rooms disposed inside the building, each containing UPS and substation distribution equipment, and air conditioning equipment that is connected to certain of the plurality of condenser unit devices; and
   a power spine room disposed between the three separate UPS and substation distribution equipment rooms and the data sector, the power spine room including a plurality of PDU devices, configured to receive power;
   three separate power switching rooms disposed inside the building, each power switching room containing power switching equipment configured to supply electrical power to the power spine room and further configured to switch to a redundant power source to supply power from the redundant power source to the power spine room;
   two or more air handler and fluid cooler devices disposed exterior to the building; and
   two or more condenser unit devices disposed exterior to the building.

23. The data center of claim 22, wherein the redundant power source comprises three backup generators.

24. The data center of claim 22, wherein the redundant power source comprises four backup generators.

25. The data center of claim 23, wherein a backup generator is associated with each of the three separate power switching rooms.

26. The data center of claim 22, further comprising a plurality of air handler and fluid cooler devices disposed exterior to the building and a plurality of condenser unit devices disposed exterior to the building.

27. The data center of claim 26, wherein the plurality of air handler and fluid cooler devices are located on an opposite exterior wall than the plurality of condenser unit devices.

28. The data center of claim 22, wherein the three separate power switching rooms form a tri-redundant switching system.

29. The data center of claim 28, wherein the tri-redundant power switching rooms are color coded with RGB.

30. The data center of claim 23, further comprising a dedicated power line interconnecting each of the three separate power switching rooms to a corresponding one of the redundant power sources.

31. The data center of claim 22, wherein the three separate UPS and substation distribution equipment rooms consist of a first room with a first associated color, a second separate room with a second associated color, and a third separate room with a third associated color.

32. A data center comprising:
   a building having a plurality of rooms inside the building, the rooms comprising:
   a data sector room inside the building to house data electronic data processing devices;
   a first, second and third UPS and substation distribution equipment rooms, each of which are separate, disposed inside the building, the first UPS and substation distribution equipment room associated with a first color, the second UPS and substation distribution equipment room associated with a second color, the third UPS and substation distribution equipment room associated with a third color, and each UPS and substation distribution equipment room containing UPS and substation distribution equipment; and
   a power spine room disposed between the three separate UPS and substation distribution equipment rooms and the data sector, the power spine room including a plurality of PDU devices, configured to receive power;
   a first, second, and third power switching rooms, each of which are separate, disposed inside the building, the first power switching room associated with the first color, the second power switching room associated with the second color, the third power switching room associated with the third color, each power switching room containing power switching equipment configured to supply electrical power to the power spine room and further configured to switch to a redundant power source to supply power from the redundant power source to the power spine room;
   two or more air handler and fluid cooler devices disposed exterior to the building; and
   two or more condenser unit devices disposed exterior to the building.

33. The data center of claim 32, wherein an the first color is red, the second color is gray, and the third color is blue.

* * * * *